United States Patent
Zejda et al.

(10) Patent No.: US 10,354,733 B1
(45) Date of Patent: Jul. 16, 2019

(54) SOFTWARE-DEFINED MEMORY BANDWIDTH REDUCTION BY HIERARCHICAL STREAM BUFFERING FOR GENERAL MATRIX MULTIPLICATION IN A PROGRAMMABLE IC

(71) Applicant: Xilinx, Inc., San Jose, CA (US)

(72) Inventors: Jindrich Zejda, Saratoga, CA (US); Elliott Delaye, San Jose, CA (US); Ashish Sirasao, San Jose, CA (US); Yongjun Wu, Cupertino, CA (US); Aaron Ng, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 15/786,321

(22) Filed: Oct. 17, 2017

(51) Int. Cl.
| | | |
|---|---|---|
| *G11C 8/00* | (2006.01) | |
| *G11C 16/10* | (2006.01) | |
| *G06N 3/04* | (2006.01) | |
| *G06F 12/06* | (2006.01) | |
| *G06F 13/16* | (2006.01) | |
| *G06N 20/00* | (2019.01) | |

(52) U.S. Cl.
CPC ........ *G11C 16/102* (2013.01); *G06F 12/0692* (2013.01); *G06F 13/1673* (2013.01); *G06N 3/04* (2013.01); *G06N 20/00* (2019.01)

(58) Field of Classification Search
CPC .. G06F 12/0692; G06F 13/1673; G06F 15/18; G06F 3/04; G11C 16/102
See application file for complete search history.

(56) References Cited

U.S. PATENT DOCUMENTS

| | | | | |
|---|---|---|---|---|
| 6,272,052 B1 * | 8/2001 | Miyauchi | ............... | G06F 3/0613 |
| | | | | 365/185.29 |
| 6,346,825 B1 | 2/2002 | Pang et al. | | |
| 6,487,102 B1 * | 11/2002 | Halbert | ..................... | G11C 5/02 |
| | | | | 365/51 |
| 7,783,936 B1 * | 8/2010 | Hall | ..................... | G06F 11/1008 |
| | | | | 714/701 |
| 8,694,857 B2 * | 4/2014 | Wang | ...................... | G06F 11/10 |
| | | | | 714/763 |
| 9,711,194 B2 * | 7/2017 | Blott | .................... | G11C 7/1057 |

OTHER PUBLICATIONS

Akesson, Benny, "An introduction to SDRAM and memory controllers," downloaded Sep. 25, 2017 from http://www.es.ele.tue.nl/premadona/files/akesson01.pdf, pp. 1-30, Eindhoven University of Technology, Eindhoven, The Netherlands.

Chetlur, Sharan et al., "cuDNN: Efficient Primitives for Deep Learning," submitted Oct. 3, 2014, pp. 1-9, https://arxiv.org/pdf/1410.0759.pdf, Cornell University Library.

(Continued)

*Primary Examiner* — Pho M Luu
(74) *Attorney, Agent, or Firm* — Steven Roberts

(57) ABSTRACT

Methods and apparatus are described for partitioning and reordering block-based matrix multiplications for high-speed data streaming in general matrix multiplication (GEMM), which may be implemented by a programmable integrated circuit (IC). By preloading and hierarchically caching the blocks, examples of the present disclosure reduce the double data rate (DDR) memory intake bandwidth for software-defined GEMM accelerators.

20 Claims, 12 Drawing Sheets

(56) References Cited

OTHER PUBLICATIONS

Di Carlo, Stefano et al., "An Area-Efficient 2-D Convolution Implementation on FPGA for Space Applications," Proc. of the 2011 IEEE 6th International Design & Test Workshop, Dec. 11, 2011, pp. 88-92, IEEE, Piscataway, New Jersey, USA.

Gysel, Philipp, "Ristretto: Hardware-Oriented Approximation of Convolutional Neural Networks," May 20, 2016, pp. 1-73, https://arxiv.org/abs/1605.06402, Cornell University Library.

Khronos, "clSetKernelArg," downloaded Sep. 22, 2017 from https://www.khronos.org/registry/OpenCL/sdk/1.0/docs/man/xhtml/clSetKernelArg.html, copyright 2007, pp. 1-4, Khronos Group, Beaverton, Oregon, USA.

Krizhevsky, Alex et al., "ImageNet Classification with Deep Convolutional Neural Networks," Proc. of the 12th International Conference on Neural Processing Systems, Dec. 3, 2012, pp. 1097-1105, ACM Digital Library, www.acm.org.

Mathworks, "im2col," dowloaded Sep. 22, 2017 from https://www.mathworks.com/help/images/ref/im2col.html?searchHighlight=im2col&s_tid=doc_srchtitle, pp. 1-3.

Saxena, Abhineet, "Convolutional Neural Networks (CNNs): An Illustrated Explanation," Jun. 20, 2016, downloaded Sep. 25, 2017 from http://xrds.acm.org/blog/2016/06/convolutional-neural-networks-cnns-illustrated-explanation/, pp. 1-15.

Shaaban, Muhammed, "Systolic Architectures," Mar. 11, 2003, Kate Gleason College of Engineering, Rochester Institute of Technology, Rochester, New York, USA.

Stanford, "CS231n Convolutional Neural Networks for Visual Recognition," downloaded Sep. 25, 2017 from http://cs231n.stanford.edu/, pp. 1-23, Stanford University, Stanford, California, USA.

Warden, Pete, "Why GEMM is at the heart of deep learning," Apr. 20, 2015, pp. 1-9, downloaded from https://petewarden.com/2015/04/20/why-gemm-is-at-the-heart-of-deep-learning/.

Wikipedia, "Convolutional neural network," Sep. 20, 2017, pp. 1-13, downloaded from https://en.wikipedia.org/wiki/Convolutional_neural_network.

Wikipedia, "Deep learning," Sep. 24, 2017, pp. 1-13, downloaded from https://en.wikipedia.org/wiki/Deep_learning.

Wikpedia, "Matrix Multiplication," Sep. 20, 2017, pp. 1-19, downloaded from https://en.wikipedia.org/wiki/Matrix_multiplication.

Wikipedia, "Multiprocessing," May 10, 2017, pp. 1-4, downloaded from https://en.wikipedia.org/wiki/Multiprocessing.

Wikipedia, "Producer-consumer problem," Sep. 7, 2017, pp. 1-9, downloaded from https://en.wikipedia.org/wiki/Producer%E2%80%93consumer_problem.

Wikipedia, "Row- and colum-major order," Aug. 23, 2017, pp. 1-5, downloaded from https://en.wikipedia.org/wiki/Row-_and_column-major_order.

Wikipedia, "Systolic array," Mar. 22, 2017, pp. 1-5, downloaded from https://en.wikipedia.org/wiki/Systolic_array.

Wikipedia, "Very long instruction word," Jul. 13, 2017, pp. 1-3, downloaded from https://en.wikipedia.org/wiki/Very_long_instruction_word.

Xilinx, "Smarter Data Center," downloaded Sep. 22, 2017 from https://www.xilinx.com/applications/data-center.html, pp. 1-4, Xilinx, Inc., San Jose, California, USA.

Xilinx, "SDSoC Development Environment," downloaded Sep. 22, 2017 from https://www.xilinx.com/products/design-tools/software-zone/sdsoc.html, pp. 1-16, Xilinx, Inc., San Jose, California, USA.

Xilinx, "UltraScale Architecture DSP Slice User Guide," UG579 (v1.3), Nov. 24, 2015, pp. 1-74, Xilinx, Inc., San Jose, California, USA.

Xilinx, "Vivado High-Level Synthesis," downloaded Sep. 22, 2017 from https://www.xilinx.com/products/design-tools/vivado/integration/esl-design.html, pp. 1-2, Xilinx, Inc., San Jose, California, USA.

Xilinx, "Deep Learning with INT8 Optimization on Xilinx Devices," WP486 (v1.0.1), Apr. 24, 2017, pp. 1-11, Xilinx, Inc., San Jose, California, USA.

Xilinx, "Implementing Memory Structures for Video Processing in the Vivado HLS Tool," XAPP793 (v1.0), Sep. 20, 2012, pp. 1-8, Xilinx, Inc., San Jose, California, USA.

Xilinx, "Two-Dimensional Linear Filtering," XAPP933 (v1.1), Oct. 23, 2007, pp. 1-8, Xilinx, Inc., San Jose, California, USA.

Wikipedia, "Matrix Multiplication algorithm," Jan. 28, 2019, pp. 1-9, downloaded from https://en.wikipedia.org/wiki/Matrix_multiplication_algorithm.

* cited by examiner

| Property | 1) Unlimited array size (theoretical) | 2) Unbuffered block | 3) Hierarchically buffered |
|---|---|---|---|
| Operation | Streams entire columns of A and rows of B into the array and accumulation in C | Streams small blocks of sizes $M*K/P^2$, $N*K/P^2$ in and $M/N/P^2$ out repeatedly ($\sim N^2/P^2$) | Reuses same size blocks by the buffering factor |
| Data moved | $M*K+N*K+M*N$ $\sim 3*N^2$ | $M*K/P^2 * P^3 +$ $N*K/P^2 * P^3 +$ $M*N/P^2 * P^4$ $\sim 2*P^2 + P^3$ | $M*K/P^2 * P^3 /$ $NW +$ $N*K/P^2 * P^3 / MH$ $+$ $M*N/P^2 * P^4 /$ $KD^2 / MH / NW$ |
| Data volume through DDR (in blocks) | $3 * P^2$ | $\sim (P - 1/3)$ times more | $\sim$ better by MH to $MH^2$ |

FIG. 12

SOFTWARE-DEFINED MEMORY BANDWIDTH REDUCTION BY HIERARCHICAL STREAM BUFFERING FOR GENERAL MATRIX MULTIPLICATION IN A PROGRAMMABLE IC

TECHNICAL FIELD

Examples of the present disclosure generally relate to electronic circuits and, in particular, to general matrix multiplication implemented in a programmable integrated circuit (IC).

BACKGROUND

Machine learning is the science of inducing computing systems to act without being explicitly programmed. Classical machine learning includes various clustering and classification techniques, including K-means clustering, linear and logistic regressions, stochastic gradient decent, association rule learning, and the like. Deep learning is a newer frontier in machine learning. Deep learning is a class of machine learning algorithms that uses multiple layers of nonlinear processing units for feature extraction and transformation. Deep learning algorithms may be unsupervised (e.g., pattern analysis) or supervised (e.g., classification). The deep learning algorithm may be implemented using layers of an artificial neural network (ANN) (referred to herein as a "neural network").

In general, a neural network is a collection of nodes (i.e., the "neurons") that are connected (e.g., in a graph). A node in a neural network may compute a sum of weighted inputs and may add an optional bias to the sum. The output of the node is a function of the final sum (referred to as an "activation function"). Example activation functions include the sigmoid function, the hyperbolic tangent (tan h) function, the Rectified Linear Unit (ReLU) function, and the identity function. Neural network models are often organized into layers of nodes, which define a specific topology, and corresponding weights and biases. The weights and biases are referred to as network parameters.

In general, a neural network includes an input layer and an output layer and may optionally include one or more hidden layers between the input and output layers. A neural network used in deep learning applications typically includes many hidden layers, which gives rise to the term deep neural network (DNN). The layers of a neural network may be densely connected (e.g., each node in a layer is fully connected to all nodes in a previous layer) or sparsely connected (e.g., each node in a layer is connected to only a portion of the nodes in a previous layer). A convolutional neural network (CNN) is a type of DNN that includes one or more sparsely connected layers, referred to as convolutional layers. A CNN is well-suited for processing image or video data. Other types of DNNs include recurrent neural network (RNNs), which are well-suited for processing speech and text data.

SUMMARY

Examples of the present disclosure generally relate to techniques and apparatus for hierarchical buffering of matrices for general matrix multiplication, which may be implemented by a programmable integrated circuit (IC).

One example of the present disclosure is a method for multiplying matrices in hardware. The method generally includes determining a row size and a column size of a first buffer associated with a first matrix; loading, from a first memory, a portion of the first matrix into the first buffer according to the row size and the column size of the first buffer; determining a row size and a column size of a second buffer associated with a second matrix, wherein the row size of the second buffer equals the column size of the first buffer; loading, from a second memory, a portion of the second matrix into the second buffer according to the row size and the column size of the second buffer; streaming columns of the first buffer and rows of the second buffer into a compute array of a compute circuit; and multiplying, using the compute array, the portion of the first matrix by the portion of the second matrix by multiplying individual streamed columns of the first buffer with individual streamed rows of the second buffer and accumulating products of the multiplication in a third buffer associated with a third matrix. The compute circuit may be implemented by a digital signal processing (DSP) circuit, for example.

Another example of the present disclosure is an electronic circuit. The electronic circuit generally includes a first memory configured to store elements of a first matrix, a second memory configured to store elements of a second matrix, a first buffer, a second buffer, a compute circuit; and a third buffer. The first buffer is associated with the first matrix, coupled to the first memory, and configured to load, from the first memory, a portion of the first matrix according to a row size and a column size of the first buffer. The second buffer is associated with the second matrix, coupled to the second memory, and configured to load, from the second memory, a portion of the second matrix according to a row size and a column size of the second buffer, wherein the row size of the second buffer equals the column size of the first buffer. The compute circuit generally includes a compute array, is coupled to the first buffer and the second buffer, and is configured to multiply, using the compute array, the buffered portion of the first matrix by the buffered portion of the second matrix to generate a portion of a third matrix. The third buffer is associated with the third matrix, coupled to the compute circuit, and configured to buffer the portion of the third matrix.

Yet another example of the present disclosure provides an apparatus for multiplying matrices. The apparatus generally includes first means for buffering a portion of a first matrix according to a row size and a column size of the first means for buffering; second means for buffering a portion of a second matrix according to a row size and a column size of the second means for buffering, wherein the row size of the second means for buffering equals the column size of the first means for buffering; means for multiplying the buffered portion of the first matrix by the buffered portion of the second matrix to generate a portion of a third matrix; and third means for buffering the portion of the third matrix.

These and other aspects may be understood with reference to the following detailed description.

BRIEF DESCRIPTION OF THE DRAWINGS

So that the manner in which the above-recited features of the present disclosure can be understood in detail, a more particular description of the disclosure, briefly summarized above, may be had by reference to example implementations, some of which are illustrated in the appended drawings. It is to be noted, however, that the appended drawings illustrate only typical example implementations and are therefore not to be considered limiting of its scope, for the disclosure may admit to other equally effective examples.

FIG. 12 is a table comparing three example implementations of streaming systolic array general matrix multiplication (GEMM), in accordance with an example of the present disclosure.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
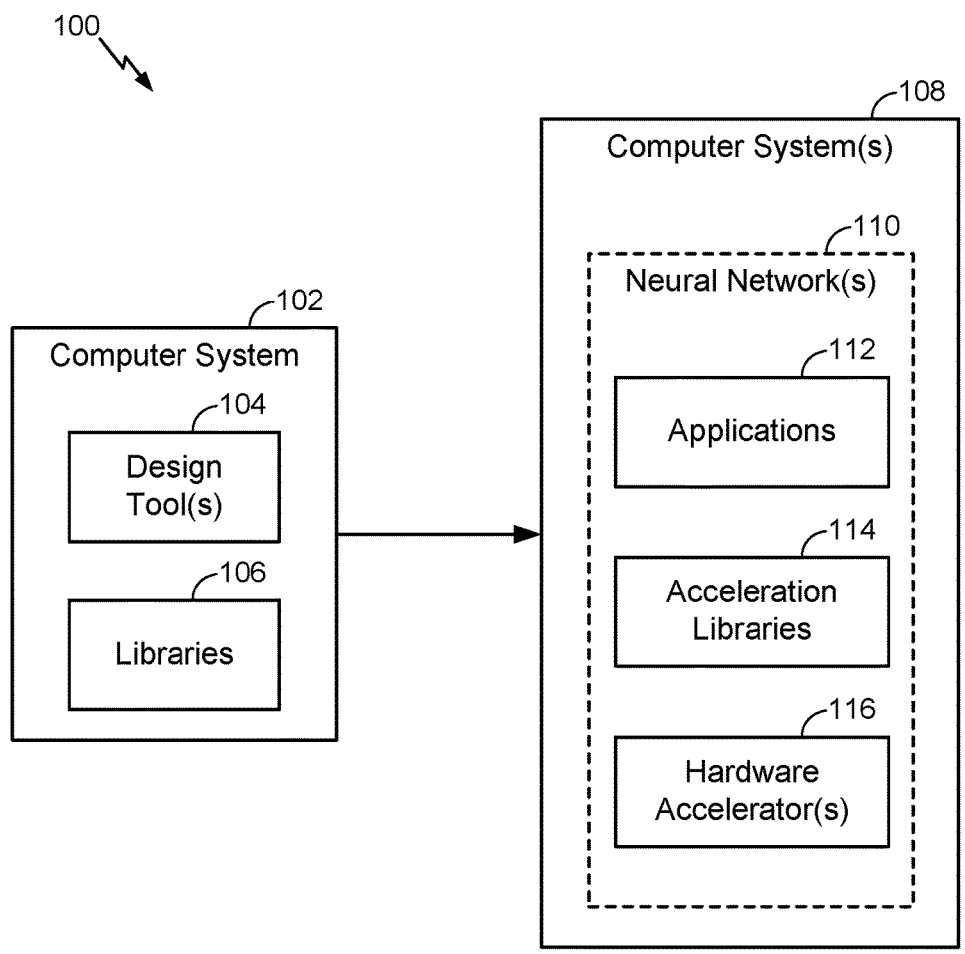
FIG. 1 is a block diagram depicting a system for implementing artificial neural networks, in accordance with an example of the present disclosure.

Examples of the present disclosure provide techniques and apparatus for partitioning and reordering block-based matrix multiplications for fast massively parallel general matrix multiplication (GEMM), which may be implemented by a programmable integrated circuit (IC). By preloading and hierarchically caching the blocks, examples of the present disclosure reduce the double data rate (DDR) memory intake bandwidth for software-defined GEMM accelerators.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples, even if not so illustrated or if not so explicitly described.

Example System for Artificial Neural Network Implementation

FIG. 1 is a block diagram depicting a system 100 for implementing neural networks, in accordance with an example of the present disclosure. The system 100 includes a computer system 102 and one or more computer systems 108. The computer system 102 includes conventional computing components configured to execute software that provides one or more design tools 104. Each computer system 108 may execute one or more neural networks 110. The neural network(s) 110 may be implemented using applications 112, acceleration libraries 114, and/or one or more hardware accelerators 116.

For some examples, the hardware accelerator(s) 116 include programmable integrated circuits (ICs), such as field programmable gate arrays (FPGAs). The acceleration libraries 114 provide application programming interfaces (APIs) to interface with the hardware accelerator(s) 116. The acceleration libraries 114 may also include libraries that provide neural network functions, including predefined and optimized implementations of neural network layers and other types of neural network structures. Thus, the neural network(s) 110 may include both hardware portions (implemented in the hardware accelerator(s) 116) and software portions (implemented in the acceleration libraries 114). The applications 112 invoke the APIs of the acceleration libraries 114 to program and control the hardware accelerator(s) 116 to implement the neural network(s) 110.

A designer interacts with the design tool(s) 104 to define the neural network(s) 110. The design tool(s) 104 may generate files for programming the hardware accelerator(s) 116 (e.g., configuration bitstreams for FPGAs), files that provide the acceleration libraries 114, and files that provide the applications 112. The designer may define the hardware portions of the neural network(s) 110 using a register transfer language (RTL) or using a programming language, such as C, C++, OpenCL, and the like, or a combination of RTL and programmable language(s). The user may define the software portions of the neural network(s) 110 using a programming language, such as C, C++, OpenCL, etc. The design tool(s) 104 compile the software-defined neural networks to generate files for programming the hardware accelerator(s) 116 and library files for the acceleration libraries 114. The designer may make use of libraries 106 that provide class libraries, template libraries, and the like to assist in developing the hardware and software portions of the neural network(s) 110.

A user may define the applications 112 using a programming language (e.g., C, C++, Python, etc.). The user may make use of neural network frameworks and libraries, such as Caffe, TensorFlow, MXNet, and the like.

Figure 2:
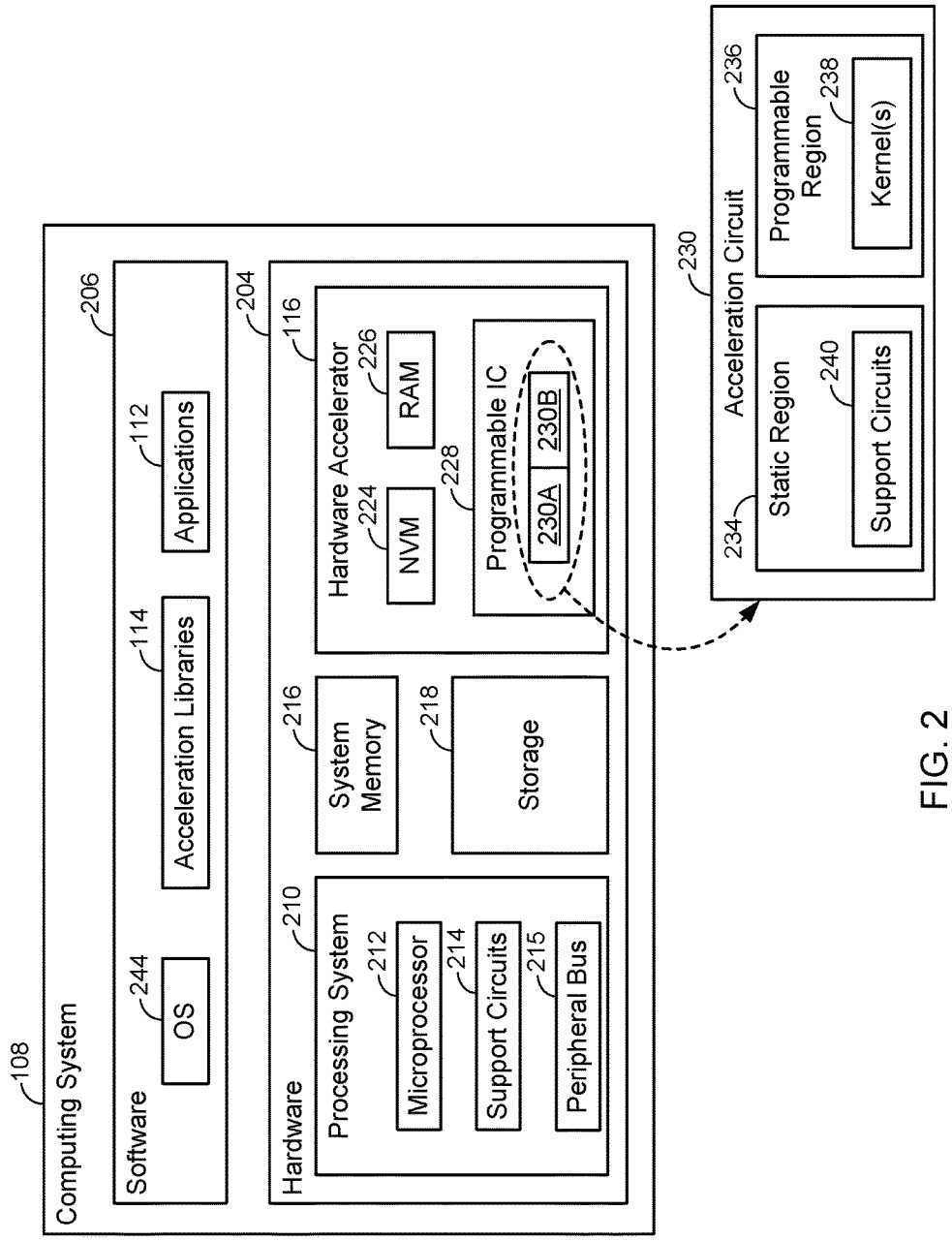
FIG. 2 is a block diagram depicting a computing system, in accordance with an example of the present disclosure.

FIG. 2 is a block diagram depicting a computer system 108, in accordance with an example of the present disclosure. The computer system 108 includes hardware 204 and software 206 executing on the hardware 204. The hardware 204 includes a processing system 210, system memory 216, storage devices ("storage 218"), and a hardware accelerator 116. The software 206 includes an operating system (OS) 244, the acceleration libraries 114, and the applications 112.

The processing system 210 includes a microprocessor 212, support circuits 214, and a peripheral bus 215. The microprocessor 212 may be any type of general-purpose central processing unit (CPU), such as an x86-based processor, ARM®-based processor, or the like. The microprocessor 212 may include one or more cores and associated circuitry (e.g., cache memories, memory management units (MMUs), interrupt controllers, etc.). The microprocessor 212 is configured to execute program code that performs one or more operations described herein and which may be stored in the system memory 216 and/or the storage 218. The support circuits 214 include various devices that cooperate with the microprocessor 212 to manage data flow between the microprocessor 212, the system memory 216, the storage 218, the hardware accelerator 116, or any other peripheral device. For example, the support circuits 214 may include a chipset (e.g., a north bridge, south bridge, platform host controller, etc.), voltage regulators, firmware (e.g., a BIOS), and the like. The support circuits 214 manage data flow between the microprocessor 212 and the peripheral bus 215, to which various peripherals, such as the hardware accelerator 116, are connected. In some examples, the microprocessor 212 may be a system-in-package (SiP), system-on-chip (SoC), or the like, which absorbs all or a substantial portion of the functionality of the chipset (e.g., north bridge, south bridge, etc.). The peripheral bus may implement an expansion bus standard, such as Peripheral Component Interconnect Express (PCIe). In the example of FIG. 2, the processing system 210 is shown separate from the hardware accelerator 116. In other examples discussed further below, the processing system 210 and the hardware accelerator 116 may be implemented on the same IC (e.g., using an SoC).

The system memory 216 is a device allowing information, such as executable instructions and data, to be stored and retrieved. The system memory 216 may include, for example, one or more random access memory (RAM) modules, such as double data rate (DDR) dynamic RAM (DRAM). The storage 218 includes local storage devices (e.g., one or more hard disks, flash memory modules, solid state disks, and optical disks) and/or a storage interface that enables the computer system 108 to communicate with one or more network data storage systems. The hardware 204 may include various other conventional devices and peripherals of a computing system, such as graphics cards, universal serial bus (USB) interfaces, and the like.

The hardware accelerator 116 includes a programmable IC 228, a non-volatile memory (NVM) 224, and RAM 226. The programmable IC 228 may be an FPGA or the like or an SoC having an FPGA or the like. The NVM 224 may include any type of non-volatile memory, such as flash memory or the like. The RAM 226 may include DDR DRAM or the like. The programmable IC 228 is coupled to the NVM 224 and the RAM 226. The programmable IC 228 is also coupled to the peripheral bus 215 of the processing system 210.

The OS 244 may be any commodity operating system known in the art, such as such as Linux®, Microsoft Windows®, Mac OS®, or the like. The acceleration libraries 114 include drivers and libraries that provide APIs for command and control of the hardware accelerator 116. The applications 112 include software executing on the microprocessor 212 that invokes the APIs of the acceleration libraries 114 to implement neural network(s).

In operation, the programmable IC 228 is configured with an acceleration circuit 230. For some examples, the acceleration circuit 230 may be a neural network accelerator or any of other various suitable types of hardware accelerators. The acceleration circuit 230 generally includes a base platform 230A and a kernel 230B. For example, the acceleration circuit 230 may be implemented using a static region 234 and a programmable region 236. The static region 234 includes support circuits 240 for providing an interface to the peripheral bus 215, the NVM 224, and the RAM 226. The programmable region 236 may include one or more kernel circuits ("kernel(s) 238"). The base platform 230A is implemented using the static region 234, and the kernel 230B is implemented using the programmable region 236. In another example, the base platform 230A may also be implemented using a portion of the programmable region 236. Thus, in some examples, the programmable region 236 also includes some interface circuits. In some examples, the acceleration circuit 230 may include more than one programmable region 236, each of which may be individually configured with kernel(s) 238.

The static region 234 is "static" in that the circuitry thereof remains constant across reconfigurations of the programmable region 236. In an example, the support circuits 240 include PCIe endpoint circuits, a direct memory access (DMA) controller, interconnects, a memory controller, a memory interface circuit (e.g., a DDR interface), decoupler circuits (to support partial reconfiguration), flash programmer, debug circuits, and the like. In some examples, the programmable region 236 does not include any of the support circuits 240. In other examples, some support circuits are implemented in the programmable region 236. In such a case, the programmable region 236 may be referred to as an "expanded programmable region." In either case, in one example, some support circuits 240 are typically present in the static region 234, such as the PCIe circuits and the DMA circuits.

Figure 3:
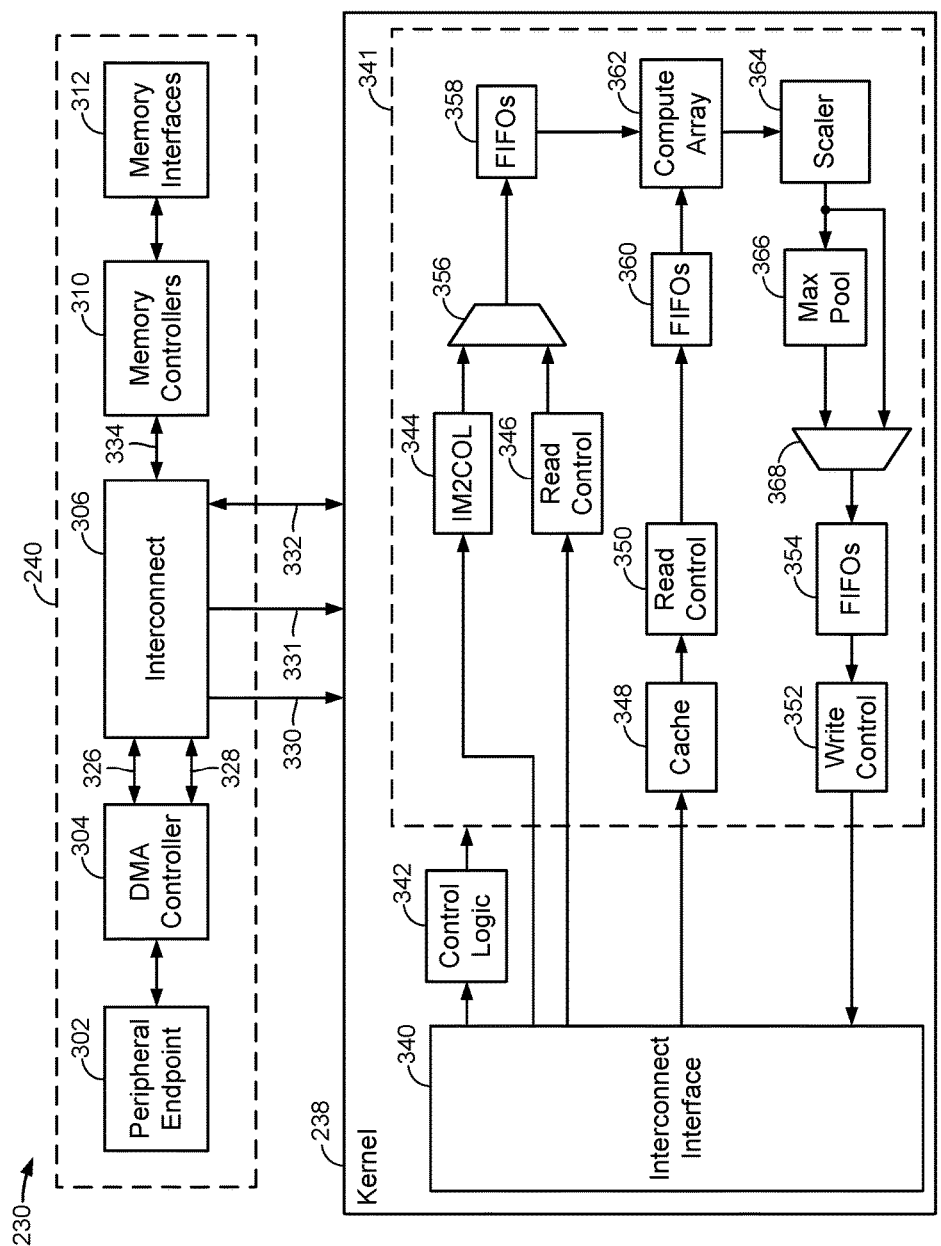
FIG. 3 is a block diagram depicting an acceleration circuit, in accordance with an example of the present disclosure.

FIG. 3 is a block diagram depicting an acceleration circuit 230, in accordance with an example of the present disclosure. The acceleration circuit 230 includes the support circuits 240 and a kernel 238. In the example, the support circuits 240 include a peripheral endpoint circuit ("peripheral endpoint 302"), a PCIe DMA controller 304, interconnect circuits ("interconnect 306"), memory controllers 310, and memory interfaces 312. The support circuits 240 may include other circuits, which are omitted for clarity (e.g., decoupler circuits, debug circuits, etc.). The peripheral endpoint 302 (e.g., a PCIe endpoint circuit) provides a physical interface to the peripheral bus 215. The PCIe DMA controller 304 facilitates DMA operations to the RAM 226 and the kernel 238. The interconnect 306 couples the PCIe DMA controller 304 to the memory controllers 310 and to the kernel 238. The memory controllers 310 are coupled to the memory interfaces 312. The memory interfaces 312 are coupled to the RAM 226.

In operation, the acceleration libraries 246 may access the RAM 226 directly through the PCIe DMA controller 304. The acceleration libraries 246 may also access the kernel 238 through the PCIe DMA controller 304. The kernel 238 may access the RAM 226 through the memory controllers 310. Data may be exchanged between the software 206 and the kernel 238 using DMA operations between the system memory 216 and the RAM 226.

In the example, the kernel 238 uses interfaces 330, 331, and 332 to communicate with the interconnect 306. In particular, these interfaces include a first read interface 330, a second read interface 331, and a read/write interface 332. For example, the read interface 330 may be used as a control interface for controlling the kernel 238. The read interface 331 may be used to read from the RAM 226 through a first one of the memory interfaces 312. The read/write interface 332 may be used to read and write from the RAM 226 through a second one of the memory interfaces 312.

The kernel 238 includes an interconnect interface 340, control logic 342, and processing circuits 341. The processing circuits 341 may include an IM2COL circuit ("IM2COL 344"), a read control circuit ("read control 346"), a multiplexer 356, first-in-first-out circuits ("FIFOs 358"), a compute array 362, a scaler circuit ("scaler 364"), a max pool circuit ("max pool 366"), a multiplexer 368, FIFOs 354, a 3-D partitioning block order unit (not shown), a write control circuit ("write control 352"), a write cache 348, a read control circuit ("read control 350"), read caches (not shown), and FIFOs 360. The block order unit may provide key inputs to read and write control and cache behavior. The interconnect interface 340 is coupled to the interfaces 330, 331, and 332, the control logic 342, and the processing circuits 341. The interconnect interface 340 may include switches, clock converters, and the like to facilitate communication between the control logic 342 and the interface 330, as well as between the processing circuits 341 and the interfaces 331 and 332. The compute array 362 may be implemented, for example, by a digital signal processor (DSP), dedicated floating point units, vector floating point or integer units, look-up tables (LUTs), or other compute hardware such as low-precision hard arithmetic logic units (ALUs) or double/complex blocks.

In the example, the interconnect interface 340 is coupled to inputs of the IM2COL circuit 344, the read control circuit 346, and the cache 348, as well as to an output of the write control circuit 352. Outputs of the IM2COL circuit 344 and the read control circuit 346 are coupled to inputs of the multiplexer 356. An output of the multiplexer 356 is coupled to an input of the FIFOs 358. An output of the FIFOs 358 is coupled to a first input of the compute array 362. An output of the cache 348 is coupled to an input of the read control circuit 350. An output of the read control circuit 350 is coupled to an input of the FIFOs 360. An output of the FIFOs 360 is coupled to a second input of the compute array 362. An output of the compute array 362 is coupled to an input of the scaler 364. An output of the scaler 364 is coupled to an input of the max pool circuit 366 and to an input of the multiplexer 368. An output of the max pool circuit 366 is coupled to another input of the multiplexer 368. An output of the multiplexer 368 is coupled to an input of the FIFOs 354, and an output of the FIFOs 354 is coupled to an input of the write control circuit 352.

In operation, the compute array 362 performs matrix multiplication operations for implementing a neural network. The inputs of the compute array 362 receive input activation matrices from the FIFOs 358 and weight matrices from the FIFOs 360. To implement fully connected layers or general purpose (GEMM), the input activation matrices may be read directly from the RAM 226 using the block order unit, caches, and the read control circuit 346. Alternatively, to perform convolution, for example, the input activations may be read from the RAM 226 and processed by the IM2COL circuit 344 for input to the compute array 362. Examples of the IM2COL circuit 344 are described below. Weight matrices may be read from the RAM 226 by the block order unit and the read control circuit 350 and cached in cache 348. The scaler 364 may scale the output of the compute array 362. The max pool circuit 366 may implement a max pooling function on the scaled output of the scaler 364. In one example, the max pool circuit 366 is implemented using configurable logic blocks (CLBs) or other configurable logic. Either the output of the max pool circuit 366 or the scaler 364 may be stored in the FIFOs 354. The write control circuit 352 writes data in the FIFOs to the RAM 226. The control logic 342 controls the various circuits in the processing circuits 341, such as the IM2COL circuit 344, the 3-D partitioning block order unit, the read control circuit 346, the multiplexers 356 and 368, the read control circuit 350, the scaler 364, the max pool circuit 366, and the write control circuit 352.

Figure 4:
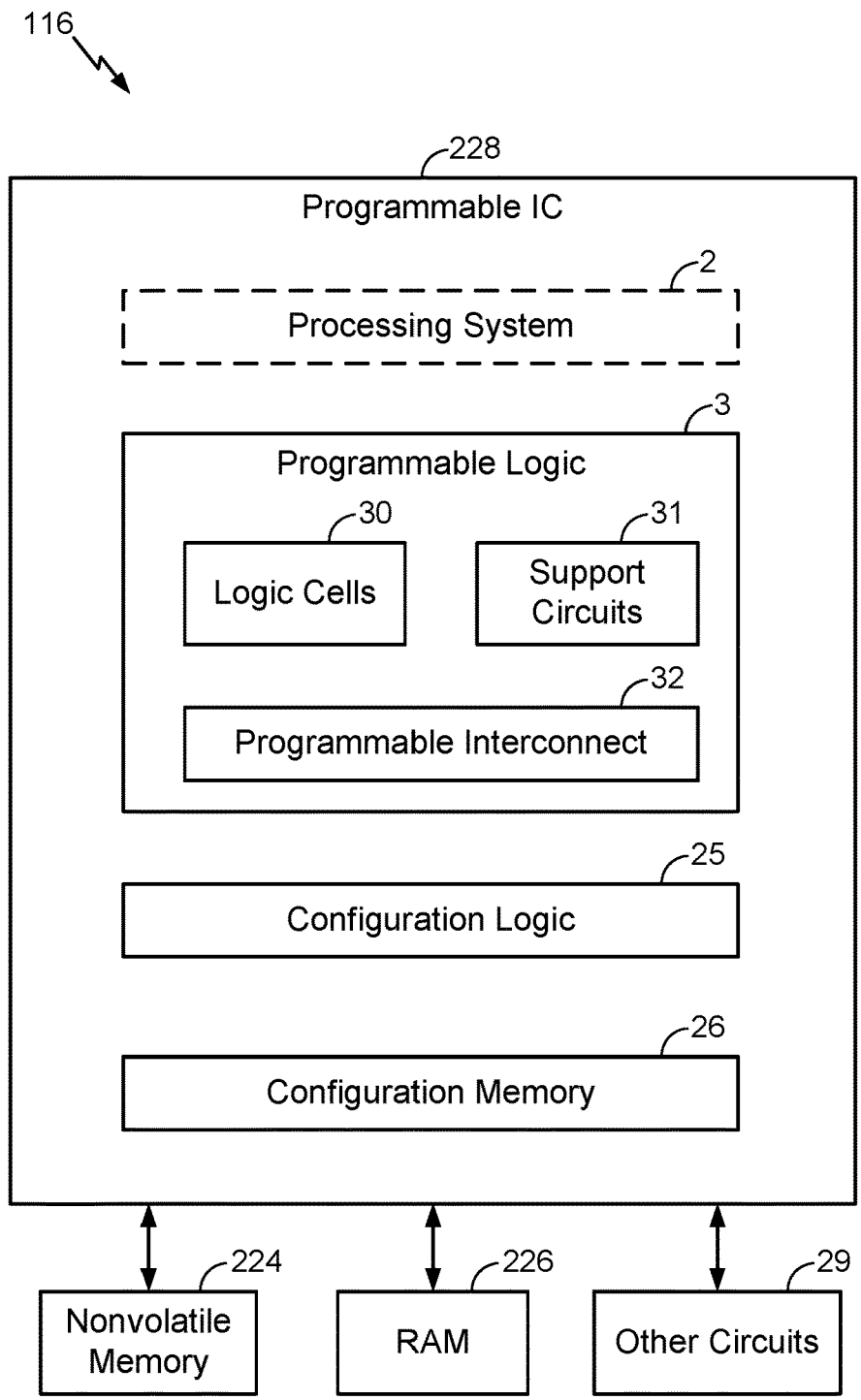
FIG. 4 is a block diagram depicting a programmable integrated circuit (IC), in accordance with an example of the present disclosure.

FIG. 4 is a block diagram depicting a programmable IC 228, in accordance with an example of the present disclosure. The programmable IC 228 includes programmable logic 3, configuration logic 25, and configuration memory 26. The programmable IC 228 may be coupled to external circuits, such as the NVM 224, the RAM 226, and other circuits 29. The programmable logic 3 includes logic cells 30, support circuits 31, and a programmable interconnect 32. The logic cells 30 include circuits that can be configured to implement general logic functions of a plurality of inputs. The support circuits 31 include dedicated circuits, such as transceivers, input/output blocks, digital signal processors, memories, and the like. The logic cells and the support circuits 31 may be interconnected using the programmable interconnect 32. Information for programming the logic cells 30, for setting parameters of the support circuits 31, and for programming the programmable interconnect 32 is stored in the configuration memory 26 by the configuration logic 25. The configuration logic 25 may obtain the configuration data from the nonvolatile memory 224 or any other source (e.g., the RAM 226 or from the other circuits 29).

In some examples, the programmable IC 228 includes a processing system 2. The processing system 2 may include microprocessor(s), memory, support circuits, I/O circuits, and the like. For example, the processing system 2 may include circuits similar to the processing system 210. In some examples, the processing system 2 may be used in place of the processing system 210. In this case, the entire computer system 108 may be implemented using the programmable IC 228, where the software 206 executes on the processing system 2.

Figure 5:
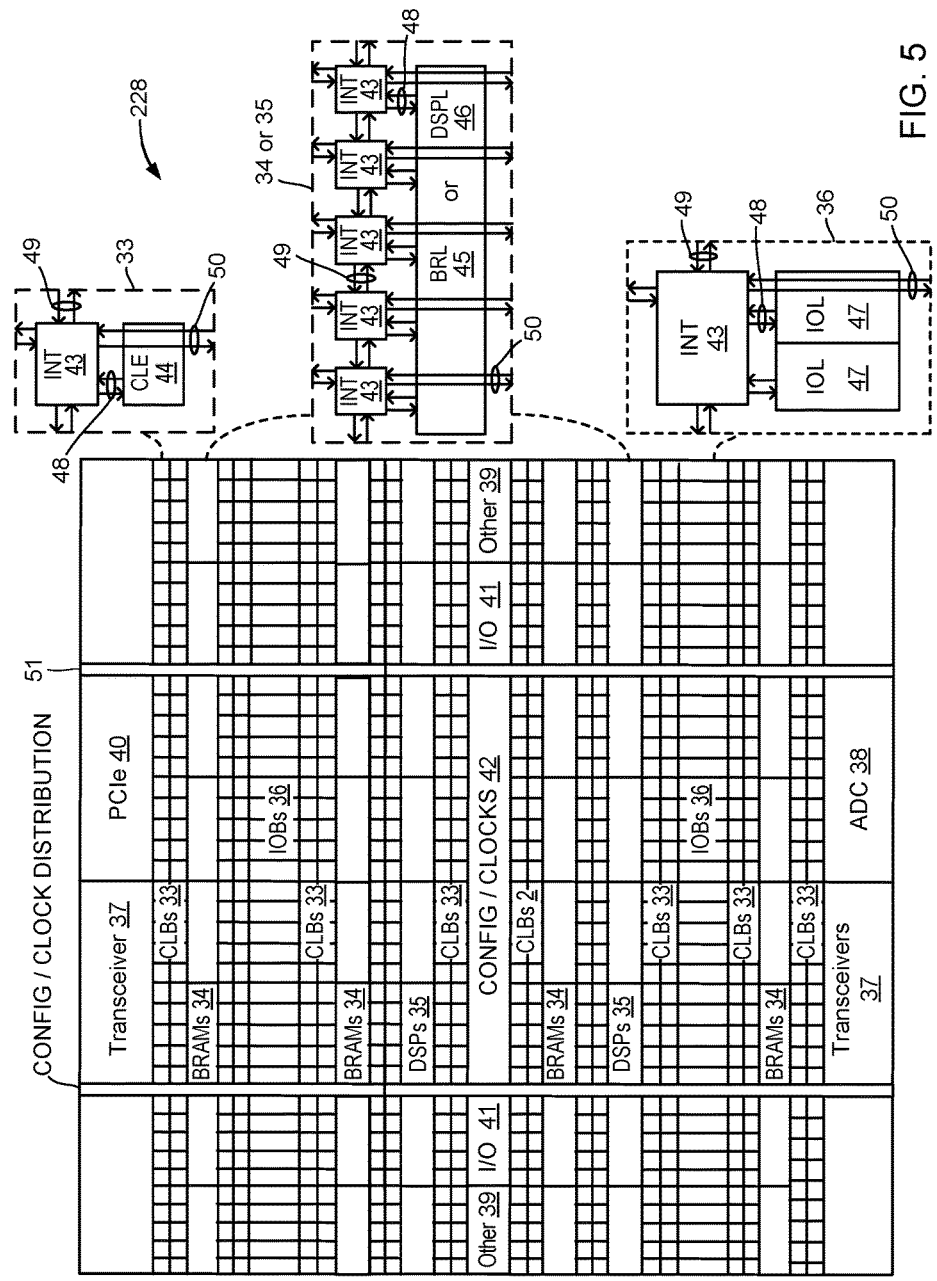
FIG. 5 illustrates a field programmable gate array (FPGA) implementation of a programmable IC, in accordance with an example of the present disclosure.

FIG. 5 illustrates an FPGA implementation of the programmable IC 228 that includes a large number of different programmable tiles including transceivers 37, configurable logic blocks ("CLBs") 33, random access memory blocks ("BRAMs") 34, input/output blocks ("IOBs") 36, configuration and clocking logic ("CONFIG/CLOCKS") 42, digital signal processing blocks ("DSPs") 35, specialized input/output blocks ("I/O") 41 (e.g., configuration ports and clock ports), and other programmable logic 39, such as digital clock managers, analog-to-digital converters, system monitoring logic, and so forth. The FPGA may also include PCIe interfaces 40, analog-to-digital converters (ADCs) 38, and the like.

In some FPGAs, each programmable tile may include at least one programmable interconnect element ("INT") 43 having connections to input and output terminals 48 of a programmable logic element within the same tile, as shown by examples included at the top of FIG. 5. Each programmable interconnect element 43 may also include connections to interconnect segments 49 of adjacent programmable interconnect element(s) in the same tile or other tile(s). Each programmable interconnect element 43 may also include connections to interconnect segments 50 of general routing resources between logic blocks (not shown). The general routing resources may include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) may span one or more logic blocks. The programmable interconnect elements 43 taken together with the general routing resources implement a programmable interconnect structure ("programmable interconnect") for the illustrated FPGA.

In an example implementation, a CLB 33 may include a configurable logic element ("CLE") 44 that may be programmed to implement user logic plus a single programmable interconnect element ("INT") 43. A BRAM 34 may include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) may also be used. A DSP tile 35 may include a DSP logic element ("DSPL") 46 in addition to an appropriate number of programmable interconnect elements. An IOB 36 may include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example of FIG. 5, a horizontal area near the center of the die is used for configuration, clock, and other control logic. Vertical columns 51 extending from this horizontal area or row are used to distribute the clocks and configuration signals across the breadth of the FPGA.

Some FPGAs utilizing the architecture illustrated in FIG. 5 include additional logic blocks that disrupt the regular columnar structure making up a large part of the FPGA. The additional logic blocks may be programmable blocks and/or dedicated logic.

Note that FIG. 5 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Example GEMM Hierarchical Buffering

Many machine learning and engineering problems can be expressed as sets of linear equations, typically formulated as a set of matrix multiplications (e.g., general matrix multiplication (GEMM)). This includes the most compute-intensive parts of machine learning: CNN's fully connected layers, multi-layer perceptrons, or most of recurrent neural network (RNN)/LSTM (long short-term memory) computation is pure matrix multiplication. CNN's convolution may be also implemented as a formatter (IM2COL) followed by GEMM. GEMM complexity is cubic, which can be expressed as $O(N^3)$. In other words, the number of operations is proportional to $N^3$ for a given GEMM problem of size N (e.g., multiplying two square matrices of N×N elements each). Each operation may access a similar amount of input and output data, $O(N^3)$. However the size of the unique input and output data is relatively small, expressed as $O(N^2)$. Thus intelligent buffering for reuse of data can bring tremendous benefit in both computational speed, as well as power savings.

Massively parallel computing (e.g., for implementing GEMM) typically involves a large amount of data being streamed in and out of a processing device at the rate of the compute engine (also referred to as the compute array). This processing device for massively parallel computing may include, for example, a compute circuit, such as a digital signal processor (DSP), which may be implemented by a programmable IC (e.g., an FPGA), and the compute array may be implemented by a DSP array in a programmable IC (e.g., the compute array 362 in the programmable IC 228). A typical massively parallel GEMM on an FPGA may employ thousands of compute elements and entail streaming in tens of gigabytes per second (GB/s) of input data without stalling. For maximum performance, the input/output (I/O) data flow bandwidth should match or exceed the compute throughput.

Figure 6:
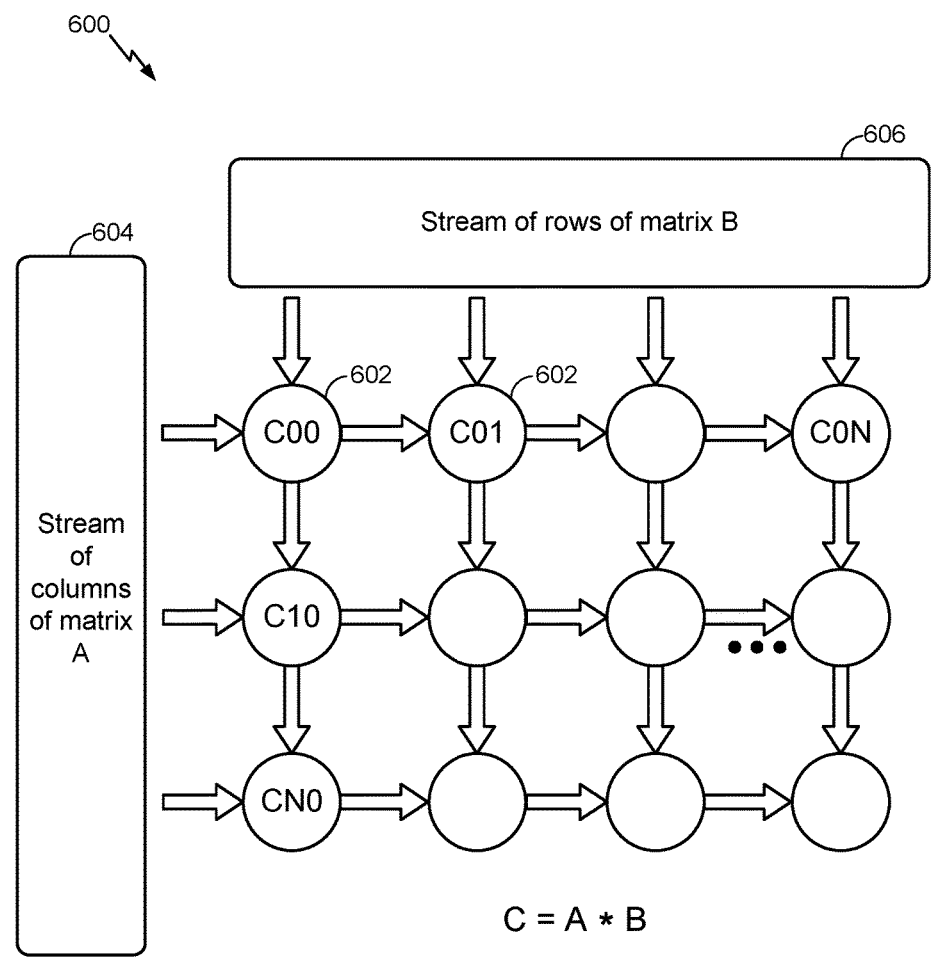
FIG. 6 illustrates an example compute array, in accordance with an example of the present disclosure.

FIG. 6 illustrates an example compute array 600, in accordance with an example of the present disclosure. The compute array 600 may have a systolic array structure of compute cores 602 suitable for use in massively parallel GEMM, for example. A compute core 602 may also be referred to as a compute element, data processing unit (DPU), cell, or node. As used herein, a systolic array generally refers to a homogeneous network of coupled DPUs. Each DPU (e.g., each compute core 602) may independently compute a partial result as a function of the data received from its upstream neighbors (e.g., to the left and/or above), store the result within the DPU itself, and pass the received data and the result downstream (e.g., to the right and/or down). For matrix multiplication, each compute core 602 may multiply two elements (one from each matrix) together, store the product, and if additional matrix elements are input to this core, add the stored product to the next multiplication result. The internal connectivity in the systolic array may increase data reuse and, thus, may lower volume of data at the edges of the array (such as from double data rate (DDR) memory or caches). For some examples, the compute array 600 may compute matrix operations C=A*B, where columns of matrix A flow left to right (e.g., the stream 604 of columns of matrix A) and rows of matrix B flow top to bottom (e.g., the stream 606 of rows of matrix B), with matrix C being accumulated in local memory of the individual compute cores 602 and offloaded when the calculation is done. The compute array 362 in FIG. 3 may be implemented with the compute array 600, where matrix A is a weight matrix read from the FIFOs 360 and matrix B is an input data matrix read from the FIFOs 358. For some examples, the input data matrix may be an image matrix, voice samples, or channels of data from activation functions of a previous neural network layer.

High performance compute accelerators (e.g., GEMM) involve rapid movement of data. In the compute array 600 of FIG. 6, the systolic array may be streaming the input data at tens to hundreds of gigabytes per second (GB/s), depending on the compute array size. As an example of the bandwidth implicated, assume a 500 MHz array of 64×64 16-bit multiply-accumulate units. At each step (e.g., a clock cycle), the array may consume 64*2 bytes=128 B of data, which implies a bandwidth of $128*500e6*2/2^{30}$=119.2 GB/s.

Historically, the bandwidth issue has been addressed in a number of ways. One conventional technique involves using local memory (e.g., BRAM or UltraRAM (URAM)), which provides adequate throughput, but can be limited in both size and ease of integration. Furthermore, using local memory may shift the bandwidth problem, since filling the local memory may remain a problem. Another conventional technique entails creating an application-specific generator, which may, for example, stream compressed data in, decompress the data, and then send the decompressed data into the compute array. Generally, this may be thought of as a temporary solution, since there may likely be a better design that can implement the GEMM on the compressed data directly (e.g., IM2COL+GEMM versus a dedicated convolution engine). Yet another conventional technique involves recirculating the input data. However, this may be limited by the length of the data that fits on the array. In addition, recirculating the data may prove challenging for timing closure in the hardware accelerator (e.g., hardware accelerator 116) due to the long topological distance along the loopback data path.

Examples of the present disclosure solve the problem of the high double data rate (DDR) bandwidth by combining the use of a local (e.g., BRAM or URAM) buffer and altering the block-based matrix multiplication algorithm (also referred to as the divide-and-conquer algorithm). In this manner, buffer sizes may be reduced (compared to non-hierarchical streaming GEMM or GEMM-unaware caches). In addition, the use of a software-defined (SD) framework may allow for a single source with simple tradeoff controls, such as balancing the buffer memory resources against the desired DDR bandwidth against the systolic array shape, as well as optional asymmetry between input stream bandwidths.

Figure 7:
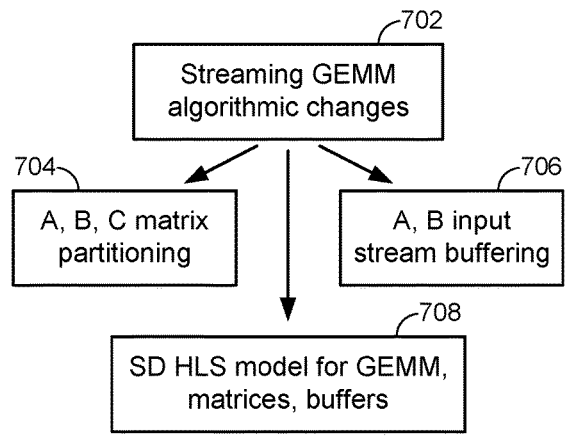
FIG. 7 illustrates a general overview of example components provided by the present disclosure.

As illustrated in FIG. 7, examples of the present disclosure may comprise several components. These may include streaming GEMM algorithmic changes 702; matrix A, B, and/or C partitioning 704, matrix A and/or B stream buffering 706, and a software-defined high-level synthesis (HLS) model 708 for GEMM, matrices, and/or buffers. These components are explained in greater detail below.

The streaming GEMM algorithmic changes 702 may involve the use of specialized block-based matrix multiplication. The dimensions of the blocks (i.e., the block sizes) may be matched with the systolic multiply-accumulate (MAC) array (e.g., the compute array 600). The block sizes may be asymmetric in the horizontal or the vertical dimension. Unlike traditional block-based matrix multiplication (BBMM), the C sub-block accumulation into matrix C may be moved out of the compute array and performed by write control 352. Also, sub-block processing on the array may be reordered to match the (software-defined) buffer sizes, rather than the other way around as in traditional BBMM algorithms.

Figure 8:
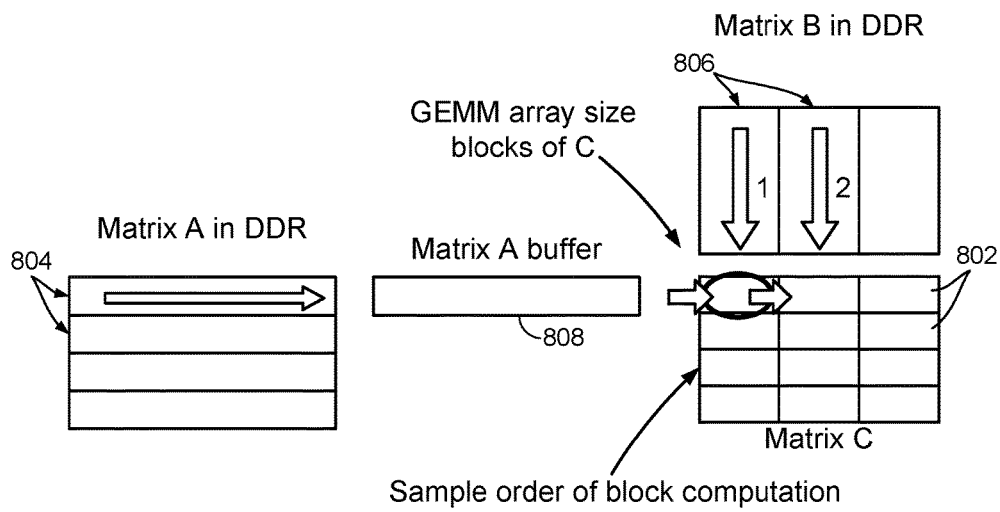
FIG. 8 illustrates example one-dimensional partitioning for buffered block-based matrix multiplication, in accordance with an example of the present disclosure.

FIG. 8 illustrates an example combination of buffered BBMM. The blocks 802 of matrix C may be computed from one-dimensional (1-D) sets of matrix A rows 804 and 1-D sets of matrix B columns 806. With a row-by-row computation order of the C blocks 802, matrix A can be buffered using buffer 808. With the 1-D partitioning, the operation is relatively simple and reuses input A and B data across the systolic array (e.g., the GEMM compute array) due to the large internal data path bandwidth. Consequently, such a solution may be optimal for certain GEMM array shapes and dimensions.

Examples of the present disclosure introduce hierarchical partitioning of the matrices in multiple dimensions (e.g., three-dimensional (3-D) partitioning). In this manner, the block processing may be tiled in such an order that flexible and predictable-size buffering may be applied to both input (e.g., matrix A and/or B) and output (matrix C) streams.

Figure 9:
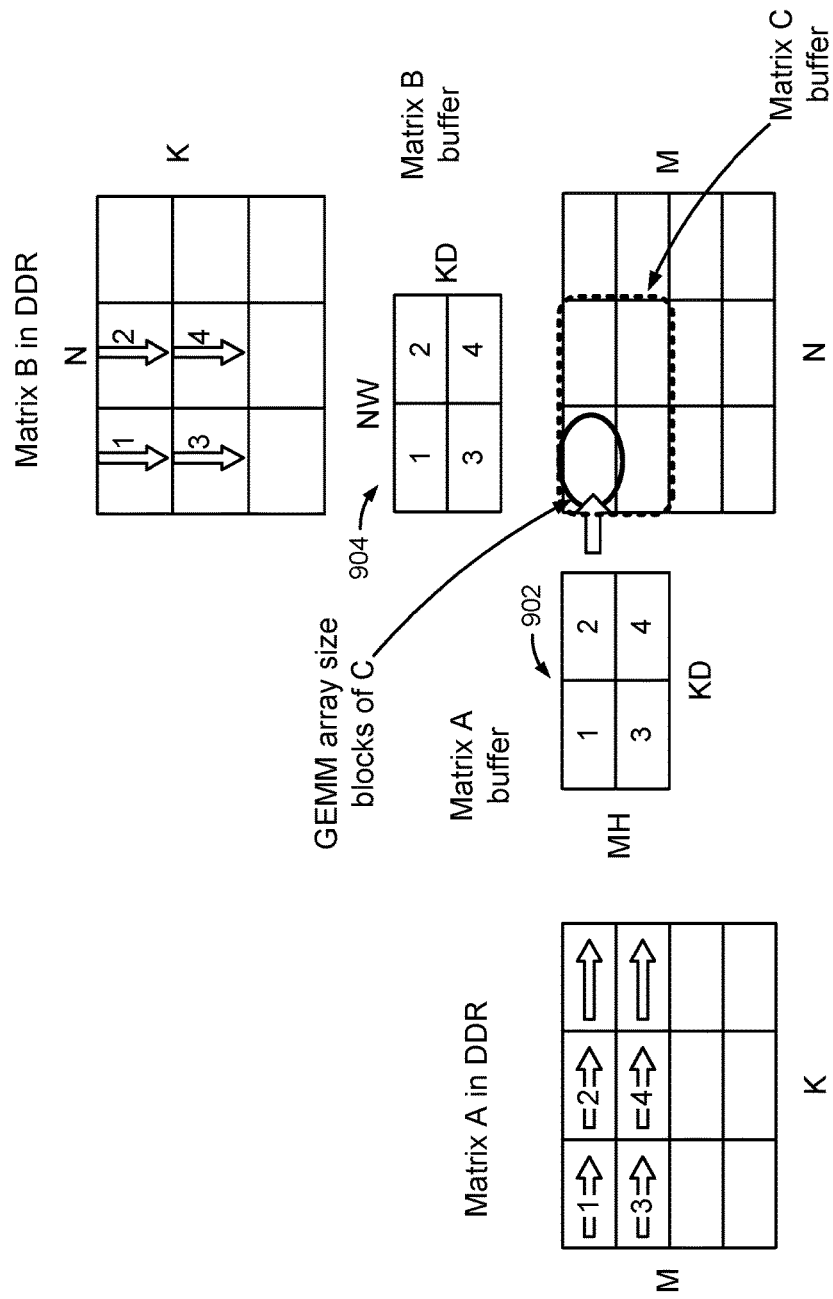
FIG. 9 illustrates example hierarchical three-dimensional partitioning for buffered block-based matrix multiplication, in accordance with an example of the present disclosure.

FIG. 9 illustrates an example hierarchical 3-D partitioning, in accordance with an example of the present disclosure. In FIG. 9, matrix A has dimensions M×K, where M is the row size of matrix A and K is the column size of matrix A. Matrix B has dimensions K×N, where K is the row size of matrix B (and matches the column size of matrix A so the matrices can be multiplied) and N is the column size of matrix B. The matrices are partitioned in all three dimensions: M, N, and K. The K-dimension partitioning may allow for controlling buffer resources, whereas the M- and N-dimension partitions may generally follow the dimensions of the compute array (e.g., compute array 600). In other words, the height (the row size, designated as MH) of the matrix A buffer 902 may be in multiples of the row size of the compute array, and the width (the column size, designated as NW) of the matrix B buffer 904 may be in multiples of the column size of the compute array. The column size (the buffer depth, designated as KD) of the matrix A buffer 902 equals the row size (again designated KD) of the matrix B buffer 904 such that the portions of the matrices loaded in the buffers 902, 904 may be multiplied. For many practical examples MH and NW are multiples (or in units of) the compute array edge sizes (i.e., the compute array dimensions according to the number of compute cores). KD may be independent of the compute array and may be in multiples of data access cache line sizes at the DDR interface or in multiples of host processor architecture alignment units.

In FIG. 9, the matrix A buffer 902 has dimensions MH=2 and KD=2 of compute array size, thus providing cached data for 2×2 block multiplication. Likewise, the matrix B buffer 904 has dimensions KD=2 and NW=2, thereby also caching data for 2×2 block multiplication. Although MH=NW (=KD) in the example of FIG. 9, MH may not equal NW (nor KD) for the matrix buffers in other examples (e.g., the matrix buffers may be asymmetrical). Furthermore, for some examples, the row size and/or the column size of each of the matrix buffers may be a value other than 2. For example, for a compute array of 32 rows and 64 columns of compute elements and an alignment unit of 16 in the K dimension, MH=2, NW=3, and KD=5 translates to a matrix A buffer with 64×80 element storage, a matrix B buffer with 80×196 element storage, and a matrix C buffer with 64×196 element storage.

For some examples, an HLS compiler may be used to express the buffers 902 and 904 in the underlying hardware (e.g., in the hardware accelerator 116, and more specifically in the processing circuit 341 of FIG. 3). One example HLS compiler is Vivado® High-Level Synthesis, which is available from Xilinx, Inc. of San Jose, Calif.

The volume of data loaded from each respective interface is reduced by MH and NW, and reloading of the data in the K-dimension may be reduced by KD as shown in the example below. Additional bandwidth reduction may result from the longer burst and fewer page loads.

The flexibility of the multi-dimensional partitioning allows for accommodating both row-major and column-major formats, which promotes accelerator interoperability. As used herein, column-major order generally refers to consecutive elements of a column in an array residing next to each other, whereas row-major order generally refers to consecutive elements of a row in the array residing next to each other. For example, in a 2×3 array with elements $a_{11}$, $a_{12}$, $a_{13}$, $a_{21}$, $a_{22}$, and $a_{23}$, the column major-order would be $a_{11}$, $a_{21}$, $a_{12}$, $a_{22}$, $a_{13}$, and $a_{23}$, reading down the columns first and then moving from left to right across the rows, whereas the row-major order would be $a_{11}$, $a_{12}$, $a_{13}$, $a_{21}$, $a_{22}$, and $a_{23}$, reading across the rows from left to right first and then moving from top to bottom down the columns.

Figure 10:
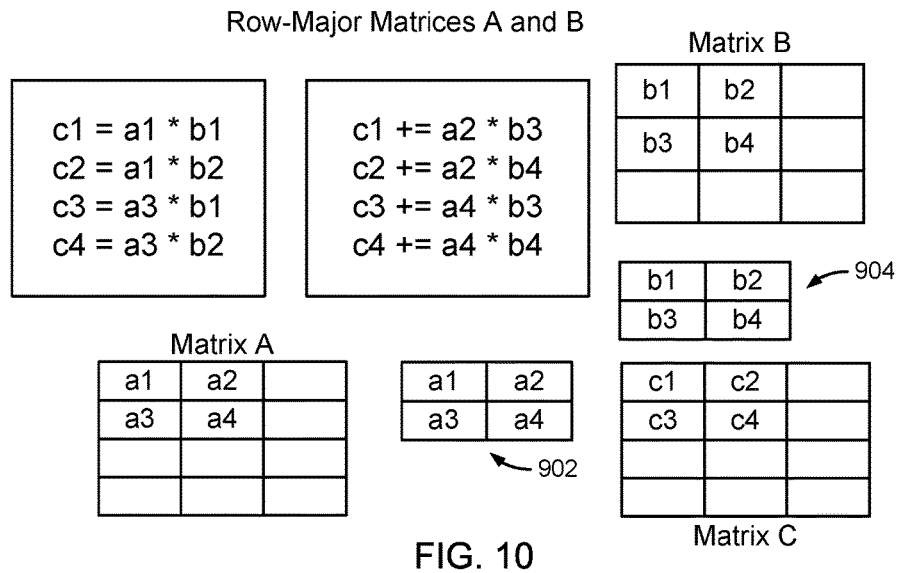
FIG. 10 illustrates example operations of hierarchical buffering for row-major matrices, in accordance with an example of the present disclosure.
Figure 11:
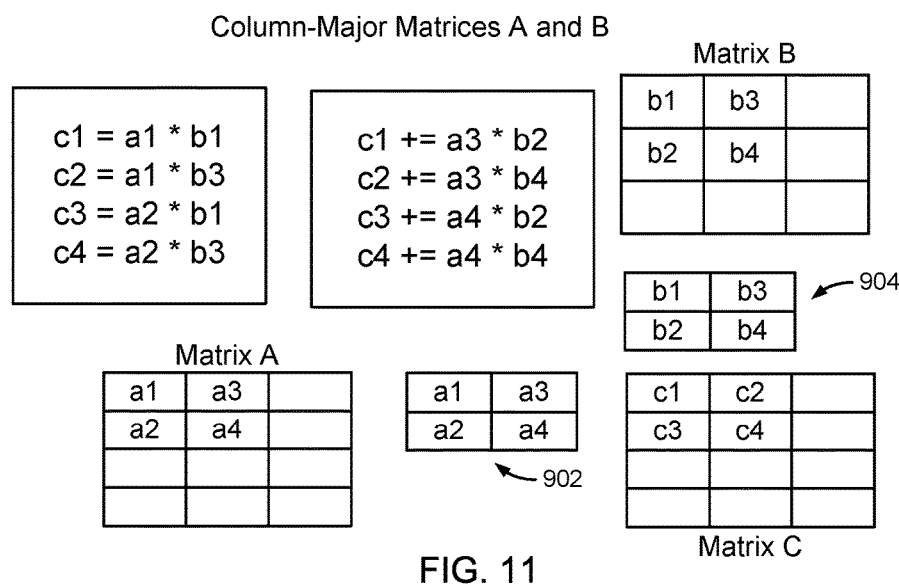
FIG. 11 illustrates example operations of hierarchical buffering for column-major matrices, in accordance with an example of the present disclosure.

FIG. 10 illustrates an example operation of hierarchical buffering for row-major matrices, in accordance with an example of the present disclosure. Here, the a2 block is loaded in the matrix A buffer 902 before the a3 block, even though a3 is streamed into the GEMM array before a2. In this manner, a2 is loaded together with a1 in a single, longer burst, thereby increasing the effective DDR throughput. In practice the burst may be KD times the width of each block ai, which represents an improvement by a factor of KD. A similar advantage may be provided for column-major matrices by reordering the block multiplication as illustrated in the example operation of hierarchical buffering in FIG. 11.

To understand the benefits of examples of the present disclosure, three example implementations of streaming systolic array GEMM are compared in table 1200 of FIG. 12. The first implementation is a theoretical one based on unlimited compute array size, where unlimited means the same or larger than the matrix dimensions. The second implementation in the next column of table 1200 is an unbuffered partitioned implementation with a realistic compute array size. The third implementation in the rightmost column of table 1200 is a hierarchically buffered implementation, in accordance with an example of the present disclosure. The various rows of table 1200 compare the operation, the data moved, and the data volume through the DDR (in terms of blocks) for the three different example implementations. For simplicity, assume each dimension is partitioned by factor P. To make the data-volume-through-the-DDR comparison simpler, it is also assumed that M~N~K. However, the reader should understand that this assumption is just for explanation; examples of the present disclosure need not be so limited.

Typical values of N (and M and K for the above simplification) range from hundreds to thousands, while the GEMM array size is typically in the tens (e.g., sub-100). Therefore, typical P values may range from the low tens to a few hundreds. The buffer dimensions (MH, NW, and KD) may be resource limited and may typically range from low units to a few tens. From the table 1200, it can been seen that the improvement in data volume through the DDR for examples of the present disclosure ranges from MH to $MH^2$. In addition, there may be an improvement in speed due to longer bursts. Thus, for many practical values, the effective improvement for examples of the present disclosure may be closer to $MH^2$.

Accordingly, one advantage of such partitioning and data ordering is the reduced DDR bandwidth. Another advantage is flexibility of tradeoffs between the buffer sizes, partitions, and matrix formats. This advantage arises not only from the streaming algorithm, but also from the practical software-defined implementation in which various components (e.g., streaming GEMM algorithmic changes 702, matrix partitioning 704, and matrix stream buffering 706) are realized in a single-source C++ implementation using templatized dimensions and arguments.

Examples of the present disclosure may provide a software-defined use of specialized block-based matrix multiplication for FPGA acceleration of GEMM. Examples of the present disclosure may also provide a GEMM FPGA accelerator DDR bandwidth requirement reduction through hierarchical buffer and buffer loading reordering for a given host matrix order (e.g., row major versus column major). For example, column-major matrix A and row-major matrix B may provide longer burst lengths for the same buffer resource utilization as compared to both matrices A and B being column major or both row major. Examples of the present disclosure may also provide flexible tradeoff between buffer sizes, bandwidth reduction, and FPGA resources in the FPGA GEMM accelerator, and these tradeoffs may be realized via a practical, single C++ source representation.

Although hierarchical partitioning and buffering have been described above with respect to GEMM and FPGA accelerators, the reader will understand that this concept may be used for other algorithms and in other hardware circuits. For example, the idea of a software-defined algorithm, hardware circuits, and data partitioning and operation ordering for particular hardware resource and performance tradeoffs may be implemented for algorithms other than GEMM, as well as in domains other than FPGA accelerators.

Example Operations for Matrix Processing

Figure 13:
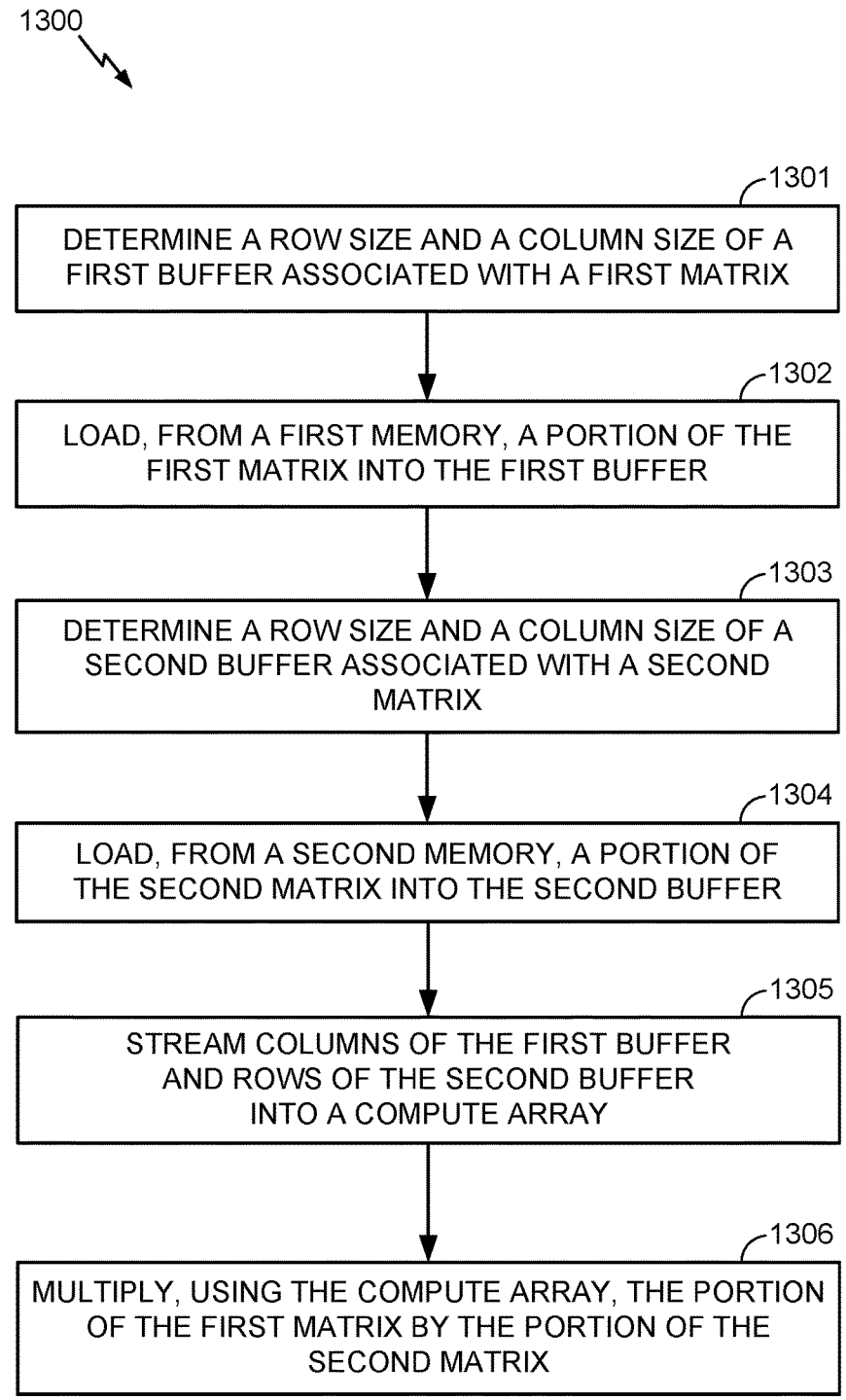
FIGS. 13 and 14 are flow diagrams of example operations for multiplying matrices, in accordance with examples of the present disclosure.

FIG. 13 is a flow diagram of example operations 1300 for multiplying matrices, in accordance with an example of the present disclosure. The operations 1300 may be performed, for example, by an electronic circuit, which may include a compute circuit (e.g., a digital signal processing (DSP) circuit) and memory. For some examples, the electronic circuit may comprise a hardware accelerator (e.g., hardware accelerator 116) comprising a programmable IC (e.g., programmable IC 228) with a compute array 362 functioning as a GEMM compute array.

The operations 1300 may begin, at block 1301, by determining a row size and a column size of a first buffer associated with a first matrix. At block 1302, the electronic circuit may load, from a first memory, a portion of the first matrix into the first buffer according to the row size and the column size of the first buffer. A row size and a column size of a second buffer associated with second matrix may be determined at block 1303. The row size of the second buffer equals the column size of the first buffer. At block 1304, the electronic circuit may load, from a second memory, a portion of the second matrix into the second buffer according to the row size and the column size of the second buffer. For some examples, the column size of the first buffer equals the row size of the second buffer. The electronic circuit may stream columns of the first buffer and rows of the second buffer into a compute array (e.g., compute array 362 or 600) of a compute circuit at block 1305. At block 1306, the electronic circuit may multiply, using the compute array, the portion of the first matrix by the portion of the second matrix. This multiplication at block 1306 may include: (1) multiplying individual streamed columns of the first buffer with individual streamed rows of the second buffer and (2) accumulating products of the multiplication in a third buffer associated with a third matrix. For some examples, the compute array may be implemented by a DSP circuit.

According to some examples, a row size of the third buffer equals the row size of the first buffer, and a column size of the third buffer equals the column size of the second buffer.

According to some examples, the compute array comprises a rectangular array of compute elements arranged according to a row size and a column size of the compute array.

According to some examples, the operations 1300 further entail repeating the loading the portion of the second matrix, the streaming, and the multiplying a number of times based on a column size of the second matrix and on the column size of the second buffer.

According to some examples, the operations 1300 further involve repeating the loading the portion of the first matrix, the streaming, and the multiplying a number of times based on a row size of the first matrix and on the row size of the first buffer.

According to some examples, dimensions of the first matrix are larger than the row size and the column size of the first buffer. Additionally or alternatively for some examples, dimensions of the second matrix are larger than the row size and the column size of the second buffer.

According to some examples, the operations 1300 further involve controlling at least one of the row size or the column size of at least one of the first buffer or the second buffer before loading at least one of the portion of the first matrix or the portion of the second matrix. For some examples, the controlling includes using high-level synthesis (HLS) to define the at least one of the row size or the column size of the at least one of the first buffer or the second buffer.

According to some examples, the compute array implements one or more layers of a convolutional neural network. In this case, the first matrix may be a weight matrix, and the second matrix may be an input data matrix, which may include an image matrix, voice samples, or channels of data from activation functions of a previous neural network layer.

According to some examples, the compute array is implemented as a DSP array in a programmable IC (e.g., programmable IC 228).

According to some examples, the first memory comprises a first location in a double data rate (DDR) dynamic random access memory (DRAM) and the second memory comprises a second location in the same DDR DRAM.

Figure 14:
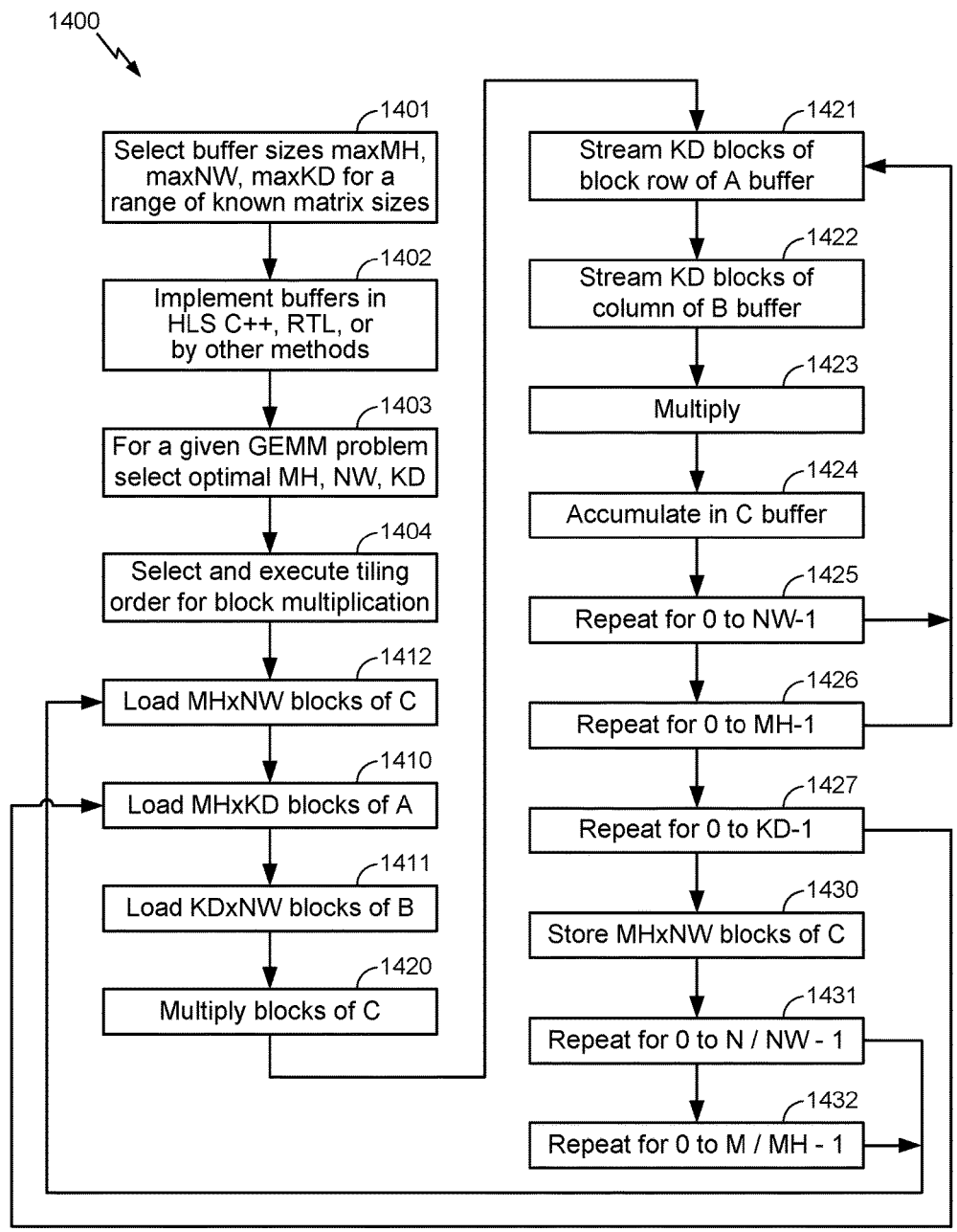

FIG. 14 is a flow diagram of example operations 1400 for multiplying matrices, in accordance with an example of the present disclosure. The operations 1400 may be performed, for example, by an electronic circuit, which may include a compute circuit (e.g., a digital signal processing (DSP) circuit) and memory. For some examples, the electronic circuit may comprise a hardware accelerator (e.g., hardware accelerator 116) comprising a programmable IC (e.g., programmable IC 228) with a compute array 362 functioning as a GEMM compute array.

The operations 1400 may begin, at step 1401, by selecting buffer sizes maxMH, maxNW, and maxKD for a range of known matrix sizes. One purpose of this selection at step 1401 is to provide support for a set of neural networks or other computational problems without having to recompile the accelerator kernel (e.g., the acceleration circuit 230). Another reason is to allow all or a subset of involved matrices to entirely reside in buffers (such as BRAM or URAM), thus eliminating DDR access completely. At step 1402, the buffers (having the selected buffer sizes) may be implemented using any of various suitable techniques, such as HLS compilation, hand-coded or generated RTL, or an ASIC block. Preliminary steps 1401 and 1402 may occur at the time of designing the accelerator. The remaining steps (starting with step 1403) may occur during runtime (when the accelerator is actually being used).

At step 1403, an actual MH, NW, and KD may be selected for the particular GEMM problem. For some examples, optimal values for MH, NW, and/or KD may be selected. The used portions of the buffers should be smaller than or equal to the maximum buffer sizes (from step 1401), as well as the GEMM problem matrix sizes. Other buffer dimension considerations include alignment, as well as any residual. For example, it may be more efficient to partition a matrix dimension (such as any of M, N, or K in FIG. 9) of 576 using a buffer of dimension of 512 into two loads of 288 instead of one 512 and one residual of 64, due to initial latency.

At step 1404, the tiling order for block multiplication may be selected and executed. The order may typically have two levels: for all matrix-C-buffer-size blocks (the dashed block in FIG. 9) of matrix C iterate K/KD times on block multiplication of GEMM compute-array-size blocks (the solid oval in FIG. 9) of matrix C. The execution of step 1404 is shown in detail by the remaining steps, beginning with step 1412.

At step 1412, MH×NW blocks of matrix C may be loaded. At step 1410, MH×KD blocks of matrix A may be loaded, and at step 1411, KD×NW blocks of matrix B may be loaded. The loaded blocks may be multiplied at step 1420 in the compute array (e.g., compute array 362), which may be performed by according to steps 1421-1424. At step 1421, KD blocks of a row of the matrix A buffer may be streamed, whereas KD blocks of a column of the matrix B buffer may be streamed at step 1422. Multiplication of the streamed blocks from the matrix A and B buffers may occur at step 1423 using multiplication on the compute array. At step 1424, the products may be accumulated in the matrix C buffer, which would typically be distributed within the array, such as a DSP block's accumulator register. The loops associated with steps 1425, 1426, 1427 iterate over all the dimensions (namely NW, MH, and KD) of the 3-D partitioned hierarchical buffers. The fully computed MH×NW block of matrix C is written to memory (e.g., to DDR or output FIFOs) at step 1430, and loops associated with steps 1431 and 1432 repeat the above operations along columns and along rows, respectively, for all matrix-C-buffer-sized blocks of matrix C.

Examples of the present disclosure reduce DDR bandwidth in a software-defined GEMM accelerator by partitioning and reordering sub-block multiplications. The blocks are preloaded and cached hierarchically to achieve up to $N^2$ equivalent bandwidth reduction for an N-times increase in input stream buffer sizes.

As used herein (including the claims that follow), a phrase referring to "at least one of" a list of items refers to any combination of those items, including single members. As an example, "at least one of: x, y, and z" is intended to cover: x, y, z, x-y, x-z, y-z, x-y-z, and any combination thereof (e.g., x-y-y and x-x-y-z).

While the foregoing is directed to examples of the present disclosure, other and further examples of the disclosure may be devised without departing from the basic scope thereof, and the scope thereof is determined by the claims that follow.

What is claimed is:

1. A method for multiplying matrices in hardware, comprising:
   determining a row size and a column size of a first buffer associated with a first matrix;
   loading, from a first memory, a portion of the first matrix into the first buffer according to the row size and the column size of the first buffer;
   determining a row size and a column size of a second buffer associated with a second matrix, wherein the row size of the second buffer equals the column size of the first buffer;
   loading, from a second memory, a portion of the second matrix into the second buffer according to the row size and the column size of the second buffer;
   streaming columns of the first buffer and rows of the second buffer into a compute array of a compute circuit; and
   multiplying, using the compute array, the portion of the first matrix by the portion of the second matrix by multiplying individual streamed columns of the first buffer with individual streamed rows of the second buffer and accumulating products of the multiplication in a third buffer associated with a third matrix.

2. The method of claim 1, wherein a row size of the third buffer equals the row size of the first buffer and wherein a column size of the third buffer equals the column size of the second buffer.

3. The method of claim 1, further comprising repeating the loading the portion of the second matrix, the streaming, and the multiplying a number of times based on a column size of the second matrix and on the column size of the second buffer.

4. The method of claim 1, further comprising repeating the loading the portion of the first matrix, the streaming, and the multiplying a number of times based on a row size of the first matrix and on the row size of the first buffer.

5. The method of claim 1, wherein dimensions of the first matrix are larger than the row size and the column size of the first buffer and wherein dimensions of the second matrix are larger than the row size and the column size of the second buffer.

6. The method of claim 1, further comprising controlling at least one of the row size or the column size of at least one of the first buffer or the second buffer before loading at least one of the portion of the first matrix or the portion of the second matrix.

7. The method of claim 6, wherein the controlling comprises using high-level synthesis to define the at least one of the row size or the column size of the at least one of the first buffer or the second buffer.

8. The method of claim 1, wherein the compute array implements one or more layers of a convolutional neural network, wherein the first matrix comprises a weight matrix, and wherein the second matrix comprises an image matrix.

9. The method of claim 1, wherein the compute array is implemented as a digital signal processing (DSP) array in a programmable IC.

10. The method of claim 1, wherein the streaming comprises:
loading a first column of the first buffer and a first row of the second buffer into the compute array for a first clock cycle; and
loading a second column of the first buffer and a second row of the second buffer into the compute array for a second clock cycle.

11. The method of claim 10, wherein the multiplying comprises:
multiplying individual elements of the first column of the first buffer with individual elements of the first row of the second buffer to generate products associated with the first clock cycle;
multiplying individual elements of the second column of the first buffer with individual elements of the second row of the second buffer to generate products associated with the second clock cycle;
adding the products associated with the second clock cycle to the products associated with the first clock cycle; and
storing results of the addition in the third buffer.

12. An electronic circuit comprising:
a first memory configured to store elements of a first matrix;
a second memory configured to store elements of a second matrix;
a first buffer associated with the first matrix, coupled to the first memory, and configured to load, from the first memory, a portion of the first matrix according to a row size and a column size of the first buffer;
a second buffer associated with the second matrix, coupled to the second memory, and configured to load, from the second memory, a portion of the second matrix according to a row size and a column size of the second buffer, wherein the row size of the second buffer equals the column size of the first buffer;
a compute circuit comprising a compute array, the compute circuit being coupled to the first buffer and the second buffer and configured to multiply, using the compute array, the buffered portion of the first matrix by the buffered portion of the second matrix to generate a portion of a third matrix; and
a third buffer associated with the third matrix, coupled to the compute circuit, and configured to buffer the portion of the third matrix.

13. The electronic circuit of claim 12, wherein a row size of the third buffer equals the row size of the first buffer and wherein a column size of the third buffer equals the column size of the second buffer.

14. The electronic circuit of claim 12, wherein dimensions of the first matrix are larger than the row size and the column size of the first buffer and wherein dimensions of the second matrix are larger than the row size and the column size of the second buffer.

15. The electronic circuit of claim 12, wherein the electronic circuit is configured to control at least one of the row size or the column size of at least one of the first buffer or the second buffer.

16. The electronic circuit of claim 15, wherein the at least one of the row size or the column size of the at least one of the first buffer or the second buffer are controlled by the electronic circuit using high-level synthesis (HLS).

17. The electronic circuit of claim 12, wherein the compute array implements one or more layers of a convolutional neural network, wherein the first matrix comprises a weight matrix, and wherein the second matrix comprises an image matrix.

18. The electronic circuit of claim 12, wherein the electronic circuit comprises a programmable integrated circuit (IC) and wherein the compute array is implemented as a digital signal processing (DSP) array in the programmable IC.

19. The electronic circuit of claim 12, wherein the first memory comprises a first location in a double data rate (DDR) dynamic random access memory (DRAM) and wherein the second memory comprises a second location in the same DDR DRAM.

20. An apparatus for multiplying matrices, comprising:
first means for buffering a portion of a first matrix according to a row size and a column size of the first means for buffering;
second means for buffering a portion of a second matrix according to a row size and a column size of the second means for buffering, wherein the row size of the second means for buffering equals the column size of the first means for buffering;
means for multiplying the buffered portion of the first matrix by the buffered portion of the second matrix to generate a portion of a third matrix; and
third means for buffering the portion of the third matrix.

* * * * *